US008620671B2

(12) United States Patent
Jax et al.

(10) Patent No.: US 8,620,671 B2
(45) Date of Patent: Dec. 31, 2013

(54) METHOD AND APPARATUS FOR TRANSFORMING BETWEEN DIFFERENT FILTER BANK DOMAINS

(75) Inventors: Peter Jax, Hannover (DE); Sven Kordon, Wunstorf (DE)

(73) Assignee: Thomson Licensing, Issy les Moulineaux (FR)

( * ) Notice: Subject to any disclaimer, the term of this patent is extended or adjusted under 35 U.S.C. 154(b) by 664 days.

(21) Appl. No.: 12/735,961

(22) PCT Filed: Feb. 19, 2009

(86) PCT No.: PCT/EP2009/051989
§ 371 (c)(1),
(2), (4) Date: Aug. 27, 2010

(87) PCT Pub. No.: WO2009/109468
PCT Pub. Date: Sep. 11, 2009

(65) Prior Publication Data
US 2011/0004478 A1 Jan. 6, 2011

(30) Foreign Application Priority Data
Mar. 5, 2008 (EP) .................................... 08102308

(51) Int. Cl.
*G10L 25/00* (2013.01)
*G10L 19/02* (2013.01)
*G10L 21/00* (2013.01)
*G10L 19/00* (2013.01)
*G06F 17/10* (2006.01)
*G06F 1/02* (2006.01)
*H03M 7/00* (2006.01)

(52) U.S. Cl.
USPC ........... 704/500; 704/200; 704/203; 704/220; 708/300; 708/271; 341/50

(58) Field of Classification Search
USPC .......................................... 704/200, 220, 500
See application file for complete search history.

(56) References Cited

U.S. PATENT DOCUMENTS 5,890,106 A * 3/1999 Bosi-Goldberg ............. 704/203
6,731,690 B2 * 5/2004 Harrison ....................... 375/260

(Continued)

FOREIGN PATENT DOCUMENTS

FR FR2901433 11/2007
WO WO 2006032740 A1 * 3/2006
WO WO 2007135319 A1 * 11/2007

OTHER PUBLICATIONS

Mathew, M.; Bhat, V.; Thomas, S.M.; Changhoon Yim; , "Modified MP3 encoder using complex modified cosine transform," Multimedia and Expo, 2003. ICME '03. Proceedings. 2003 International Conference on , vol. 2, No., pp. II-709-12 vol. 2, Jul. 6-9, 2003.*

(Continued)

*Primary Examiner* — Paras D Shah
(74) *Attorney, Agent, or Firm* — Tutunjian & Bitetto, P.C.

(57) ABSTRACT

Filter banks may have different structures and different individual output signal domains. Often a translation between different filter bank domains is desirable. Usually, mapping matrices are used that, however, vary over frequency. This requires a significant amount of lookup tables. A method for transforming first data frames of a first filter bank domain to second data frames of a different second filter bank domain, comprises steps of transcoding sub-bands of the first filter bank domain into sub-bands of an intermediate domain that corresponds to said second filter bank domain but has warped phase, and transcoding the sub-bands of the intermediate domain to sub-bands of the second filter bank domain, wherein a phase correction is performed on the sub-bands of the intermediate domain.

16 Claims, 6 Drawing Sheets

(56) References Cited

U.S. PATENT DOCUMENTS

| | | | | |
|---|---|---|---|---|
| 6,963,842 | B2 * | 11/2005 | Goodwin | 704/500 |
| 6,982,377 | B2 * | 1/2006 | Sakurai et al. | 84/654 |
| 7,069,209 | B2 * | 6/2006 | Chen et al. | 704/219 |
| 7,676,374 | B2 * | 3/2010 | Tammi | 704/500 |
| 2003/0014241 | A1 * | 1/2003 | Ferris et al. | 704/200.1 |
| 2005/0240398 | A1 | 10/2005 | Chen et al. | |
| 2007/0083377 | A1 * | 4/2007 | Trautmann et al. | 704/503 |
| 2007/0250308 | A1 * | 10/2007 | Lee et al. | 704/200 |
| 2008/0071528 | A1 * | 3/2008 | Ubale et al. | 704/220 |
| 2009/0024397 | A1 * | 1/2009 | Ryu et al. | 704/500 |
| 2009/0037180 | A1 * | 2/2009 | Kim et al. | 704/500 |
| 2009/0063140 | A1 * | 3/2009 | Villemoes et al. | 704/211 |
| 2009/0240507 | A1 * | 9/2009 | Jax et al. | 704/500 |
| 2009/0307294 | A1 | 12/2009 | Picard et al. | |
| 2010/0017213 | A1 * | 1/2010 | Edler et al. | 704/500 |

OTHER PUBLICATIONS

Touimi, A.B.; Mouhssine, A.; , "Efficient conversion method between subband domain representations," Multimedia and Expo, 2005. ICME 2005. IEEE International Conference on , vol., No., pp. 4 pp. Jul. 6-8, 2005.*

WO 2006/032740. English Translation dervied from http://world-wide.espacenet.com/advancedSearch?locale=en_EP, 2006.*

Fu-Shing Ju; Ce-Min Fang; , "Time-Frequency Domain Fast Audio Transcoding," Multimedia, 2006. ISM'06. Eighth IEEE International Symposium on , vol., No., pp. 750-753, Dec. 2006.*

Takagi et al., "Conversion of MP3 to AAC in the Compressed Domain" Multimedia Signal Processing, 8th Workshop on IEEE, Oct. 1, 2006, pp. 132-135.

Search Report Dated July 10, 2009.

* cited by examiner

METHOD AND APPARATUS FOR TRANSFORMING BETWEEN DIFFERENT FILTER BANK DOMAINS

This application claims the benefit, under 35 U.S.C. §365 of International Application PCT/EP2009/051989, filed Feb. 19, 2009, which was published in accordance with PCT Article 21(2) on Sep. 11, 2009 in English and which claims the benefit of European patent application No. 08102308.7, filed Mar. 5, 2008.

FIELD OF THE INVENTION

This invention relates to a method and an apparatus for transforming between different filter bank domains.

BACKGROUND

Filter banks usually perform some kind of transformation between different domain signals, e.g. between time domain signals and frequency domain signals. Filter banks may have different structures and different individual output signal domains. In many cases, translation between different filter bank domains is desirable.

The European patent application EP06120969 discloses a method and device for transcoding between encoding formats with different time-frequency analysis domains, without using the time domain, wherein linear mapping is used. Thus, only a single transcoding step needs to be performed and computation complexity is lower than with systems that use intermediate time domain signals. One of the most important embodiments disclosed in EP06120969 is the mapping from the MP3 hybrid filter bank to the Integer MDCT domain for lossless audio compression. The transcoding step has significant influence on the compression ratio of the codec. A straight-forward solution for this mapping would be to fully decode the source filter coefficients from the MP3 domain into time domain samples, and then to apply the MDCT analysis filter bank. The solution provided in EP06120969 is to apply direct mapping from the MP3 filter bank domain to the MDCT domain, omitting the time domain. In this method, a number of mapping matrices are used which are approximately diagonal, but which vary over frequency. Therefore, this straight-forward approach requires a significant amount of lookup tables.

The modified discrete cosine transform (MDCT) is a kind of Fourier transform that is based on the discrete cosine transform (DCT). It is advantageous due to its property of being lapped, since it is performed on consecutive frames, wherein subsequent frames overlap, and its good compression of signal energy. In MP3 codecs, the MDCT is applied to the output of a 32-band polyphase quadrature filter (PQF) bank. The MDCT filter output is usually post-processed by an alias reduction for reducing the typical aliasing of the PQF filter bank. Such combination of a filter bank with an MDCT is called hybrid filter bank or subband MDCT.

A problem to be solved is to reduce the size of the mapping matrices, or the corresponding lookup tables, so that more efficient implementations are possible.

SUMMARY OF THE INVENTION

The present invention accomplishes a reduction of the size of the mapping matrices, and the corresponding lookup tables, by decomposing the single-step mapping into two separate steps, wherein an intermediate filter bank domain is utilized. It has been found that such decomposition of the mapping leads to simpler mapping tables that have a more regular structure, and therefore can be compressed very efficiently. Exemplarily, it may be possible to reduce the amount of storage space required for mapping tables by a factor of more than ten. As another advantage, an increase in the computational complexity is very low. Further, it is possible to implement a device that performs certain mappings by weighting means, filtering means and adders.

According to one aspect of the invention, a method for transforming first data frames of a first filter bank domain to second data frames of a different second filter bank domain comprises steps of transcoding sub-bands of the first filter bank domain into sub-bands of an intermediate filter bank domain that corresponds to said second filter bank domain but has warped phase, and transcoding the sub-bands of the intermediate filter bank domain to sub-bands of the second filter bank domain, wherein on the sub-bands of the intermediate domain a phase correction is performed. Exemplarily, the first filter bank domain is that of an MP3 hybrid filter bank, and the second filter bank domain is that of an Integer MDCT filter bank.

Usually, the steps of transcoding a time signal into sub-bands of the intermediate filter bank domain and the second filter bank domain can be expressed as transforms that comprise a cosine function. Then the warped phase of the intermediate filter bank domain corresponds to a frequency dependent additive phase term in the cosine function.

Further, in one embodiment of the invention the step of transcoding sub-bands of the first filter bank domain into sub-bands of the intermediate filter bank domain comprises the removing of residual alias terms from the sub-bands of the first filter bank domain. Such residual alias terms are often generated by the filter bank that corresponds to the first filter bank domain, e.g. an MP3 poly-phase filter bank. In one embodiment, mapping matrices are employed, each of which comprising individual but identical sub-matrices along their main diagonals and zeros in other positions.

In one embodiment, the step of transcoding the sub-bands of the intermediate domain to sub-bands of the second filter bank domain comprises sub-band group sign correction (also called sub-band sign correction herein). A group comprises one or more filter bank domain sub-bands. A filter bank domain sub-band is also called "bin". Sub-band group sign correction refers to groups of bins and may comprise inversion of every other sub-band group of the intermediate domain signal.

According to another aspect of the invention, an apparatus for transforming first data frames of a first filter bank domain to second data frames of a different second filter bank domain comprises first transcoding means for transforming sub-bands of the first filter bank domain into sub-bands of an intermediate domain that corresponds to said second filter bank domain with warped phase, wherein residual alias terms are removed, and second transcoding means for transcoding the sub-bands of the intermediate domain to sub-bands of the second filter bank domain, wherein the second transcoding means comprises phase correction means for performing phase correction on the sub-bands of the intermediate domain.

In one embodiment, said phase correction is performed by computing means (e.g. microprocessor, DSP or parts thereof) for applying mapping matrices, while in another embodiment said phase correction in the second transcoding means is performed by weighting means for weighting and filter means for filtering the weighted sub-band coefficients of the intermediate domain.

Advantageous embodiments of the invention are disclosed in the dependent claims, the following description and the figures.

BRIEF DESCRIPTION OF THE DRAWINGS

Exemplary embodiments of the invention are described with reference to the accompanying drawings, which show in FIG. 1 the structure of an architecture for single-step mapping.

DETAILED DESCRIPTION OF THE INVENTION

Figure 1:
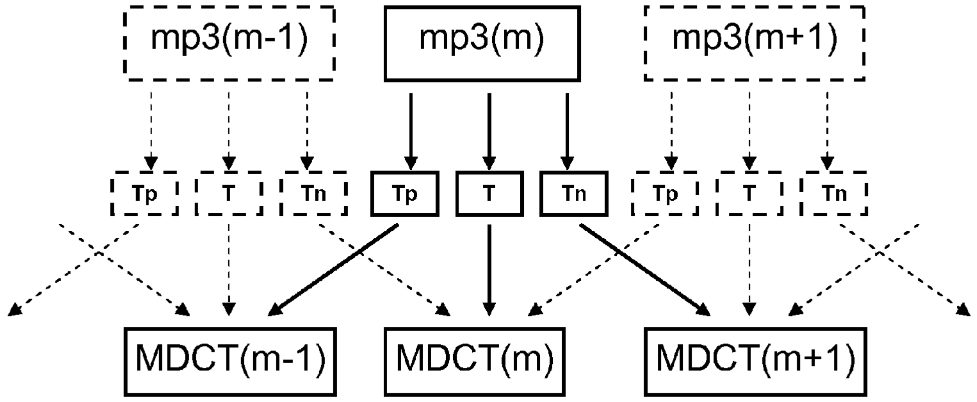

FIG. 1 illustrates the single-step mapping procedure that was disclosed in EP06120969. Each frame mp3(m) with MP3 coefficients contributes to three consecutive frames MDCT (m−1),MDCT(m),MDCT(m+1) of MDCT coefficients. Vice versa, each MDCT frame combines contributions from three MP3 frames. The mapping is performed by separate matrices Tp,T,Tn, where one matrix Tp contributes to the previous MDCT frame and one matrix Tn to the next MDCT frame.

Since there are three matrices Tp,T,Tn involved for each window type, and there are four different window types (long, short, start, and stop windows) in both MP3 filter bank domain and MDCT domain, in total 12 matrices have to be stored. Not all the matrices are different: Tp of start and long windows are the same, and Tn of stop and long windows are also identical. Nevertheless, a gross amount of memory of about 175 kBytes is required to store the lookup tables that are necessary to achieve an acceptable mapping accuracy of e.g. more than 45 dB. Note that window types/block lengths can vary over time, and may but need not be the same in the input and the output domain.

What is called "frame" here is in MP3 terminology also called "granule". However, the more general term "frame" is used in the following.

Owing to certain symmetries in the full mapping matrix, as will be shown below, the known single-step mapping can be decomposed into a sequence of multiple sub-steps. This decomposition is based on a pseudo-MDCT with warped phase, as will be introduced in the following.

Generally, a filter bank domain can be expressed as a kernel function and a cosine function. A close comparison of the kernel functions of the MP3 hybrid filter bank and the MDCT (or generally between two filter bank domains) leads to the definition of a "pseudo-MDCT", which has the same kernel function as a normal MDCT, but has a frequency-dependent phase term added to the argument of the cosine functions. This pseudo-MDCT is used as an intermediate domain in the two-step transcoding approach from MP3 to the target (original) MDCT filter bank domain.

The original MDCT has the following definition $$X(i) = \sqrt{\frac{2}{M}} \sum_{k=0}^{2M} w(n) \cdot c(n, i) \tag{1}$$

$$c(n, i) = \cos\left(\frac{\pi}{4M}(2n + M + 1)(2i + 1)\right) \tag{2}$$

Here n is the time index, i is the frequency index, and M denotes the length of the MDCT, i.e. the transformation produces M frequency bins (sub-bands), while the length of the time-domain analysis window w(n) is 2M.

The kernel function c(n,i) is responsible for the time domain alias compensation (TDAC) property of the MDCT.

The window function w(n) can be one out of four shapes, named "long", "start", "short", and "stop", according to the adaptive window switching procedure applied in the mp3 codec. For long windows $$w(n) = \sin\left(\frac{\pi}{2M}(n + 1/2)\right) \tag{3}$$

Now, we modify the definition of the cosine term c(n, i) in the definition of the MDCT by adding a frequency-dependent phase term $\phi_i$ to the argument of the cosine function:

$$\tilde{c}(n, i) = \cos\left(\frac{\pi}{4M}(2n + M + 1)(2i + 1) + \phi_i\right) \tag{4}$$

Comparison of the MDCT kernel functions with the kernel functions of the MP3 hybrid filter bank yields the following piecewise linear phase warping function that approximately maximizes the cross-correlation between corresponding kernel functions with the same index i=1, . . . , M:

$$\phi_i = \pi\left(-\frac{i}{2M} + 0.2504 + 1/2\left((-1)^{\left\lfloor\frac{i-1}{18}\right\rfloor} - 1\right)\right) \tag{5}$$

Figure 9:
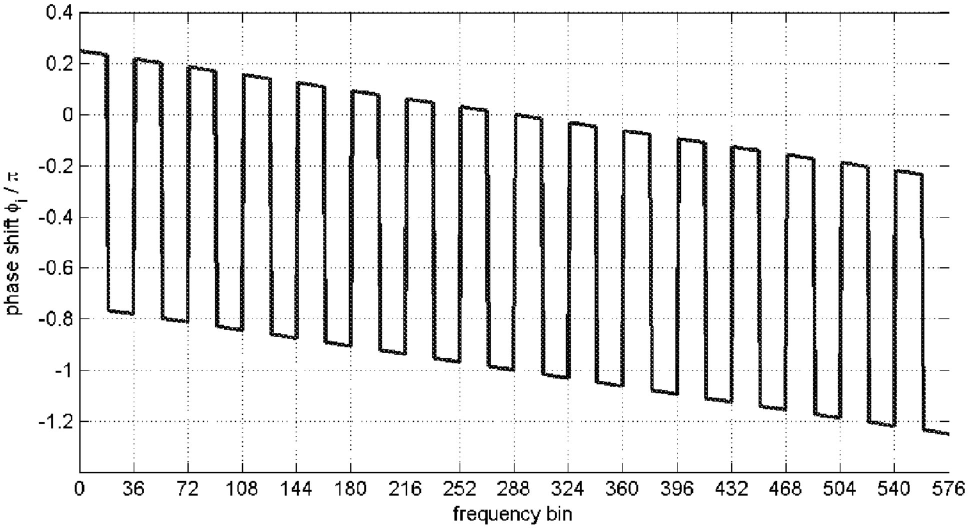
FIG. 9 values of an additive phase term within the warped intermediate filter bank domain.

The additive phase term $\phi_i$ is shown in FIG. 9. This phase term is identical for all window shapes.

Note that due to the addition of $\phi_i$ to the argument of the cosine function, the pseudo-MDCT does not have perfect reconstruction properties. Is has lost its TDAC property, and thus it is not a true MDCT. If the new kernel functions are applied as an analysis-synthesis filter bank pair, there will be time domain aliasing errors. However, the signal-to-alias ratio is only about 50 dB. This transcoding accuracy is sufficient in most applications.

Figure 10:
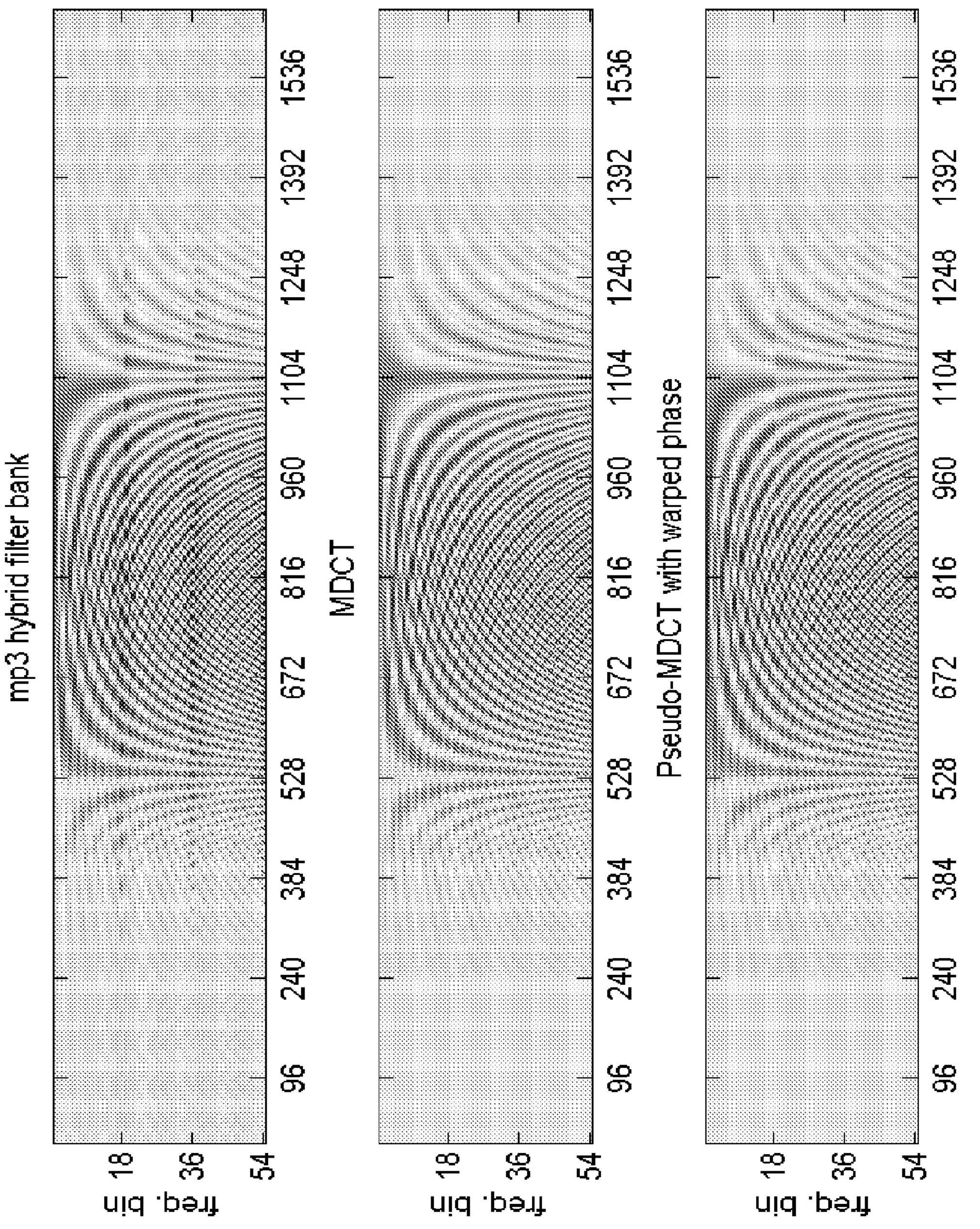
FIG. 10 a comparison of Kernel functions (long window) of MP3 filter bank, original MDCT and warped pseudo-MDCT.

To illustrate the modification, FIG. 10 shows the first 54 kernel functions (3 sub-bands of 18 bins each) of the MP3 filter bank, the MDCT with original phase and, as the intermediate format, the MDCT with warped phase. It can be observed that the phase modification of the MDCT leads to a superior match of the fine structure with that of the MP3 filter bank. Furthermore, the sub-band sign alterations of the MP3 filter bank are reflected, which are described in more detail below.

Figure 3:
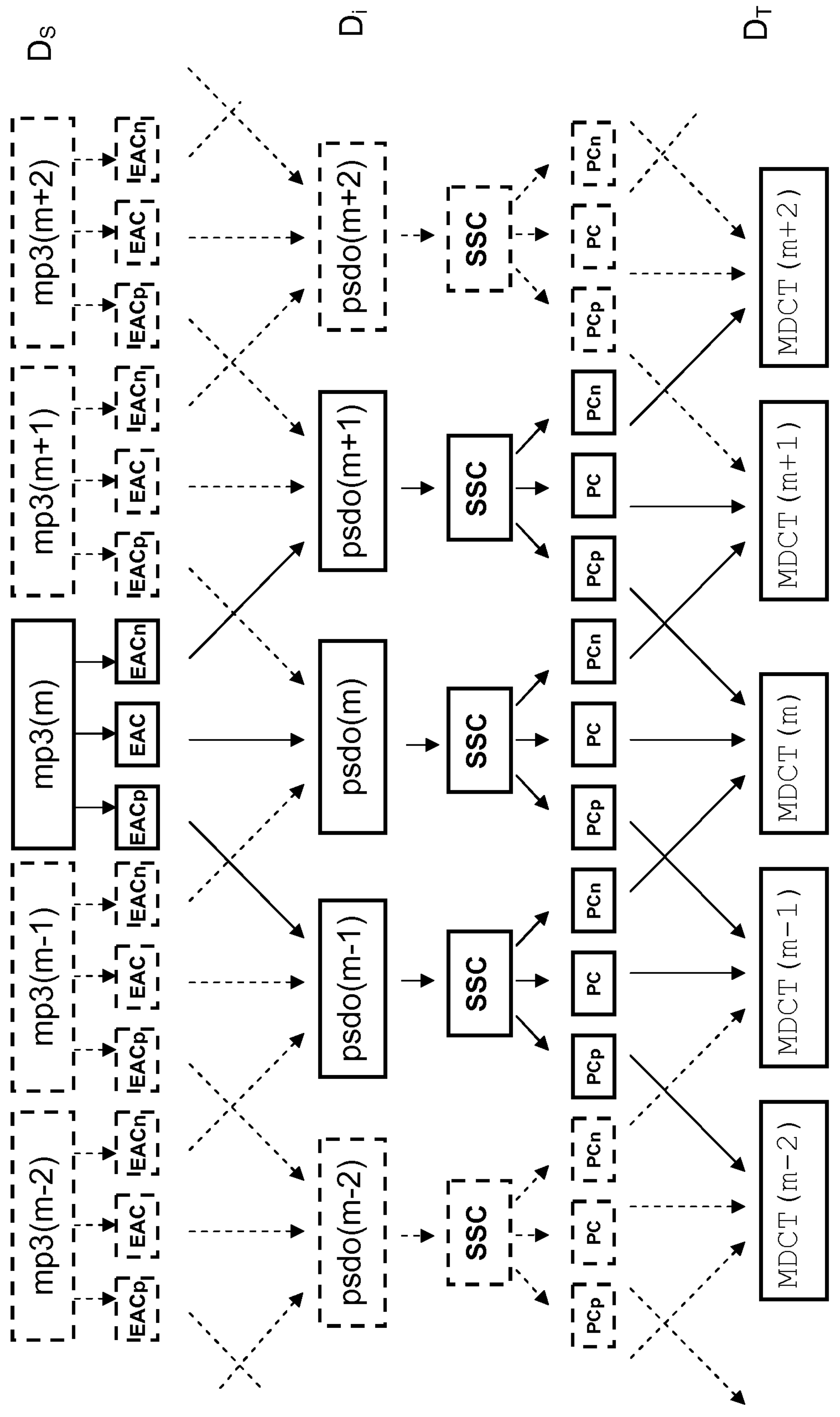
FIG. 3 the structure of an exemplary architecture or flowchart according to the invention.

FIG. 3 shows the structure of an exemplary flow-chart according to one aspect of the invention, suitable at least for MP3 to MDCT mapping. However, the principle may apply also to mappings between other filter bank domains. In principle, the decomposed mapping is realized in two major steps by first transcoding the MP3-decoded frequency bins into the pseudo-MDCT domain, which serves as intermediate domain, and then performing a phase correction to transcode from the pseudo-MDCT domain to the target MDCT domain. The two major steps can again be realized either in smaller sub-steps or by a specific, efficient implementation.

Compared to the single-step procedure of FIG. 1, the multi-step approach looks more complicated, and in fact there are slightly more algorithmic operations involved. However, the structure of the mathematical operations of each of the individual steps is less complicated than that of the single-step matrices. This makes it possible to reduce the size of the required lookup tables (and thereby the memory space required) significantly. More details on each of the sub-steps will be given in the following.

Since the pseudo-MDCT domain does not relate to a perfect reconstruction analysis-synthesis filter bank, and the two-step mapping corresponds to transcoding to and from this imperfect filter bank domain, the total mapping accuracy is constrained by the signal-to-alias ratio of the intermediate representation. Therefore, the best achievable mapping accuracy of the two-step approach (without clipping or quantization of matrices) is about 50-60 dB, which is sufficient for most applications.

In the following, the Enhanced Alias Compensation (EAC) is described. The purpose of this step is to remove the residual alias terms, which originate from the MP3 poly-phase filter bank, from the MP3 frequency bins. Thus, this step provides the mapping procedure from the MP3 filter bank domain (source filter bank domain) to the warped pseudo-MDCT (warped target filter bank domain serving as intermediate filter bank domain), as defined above.

The respective mapping matrices EACp,EAC,EACn can be found by multiplying the MP3 synthesis matrix with the analysis matrix of the pseudo-MDCT filter bank. A time shift is applied in addition for the contributions to previous frames and next frames.

Figure 6:
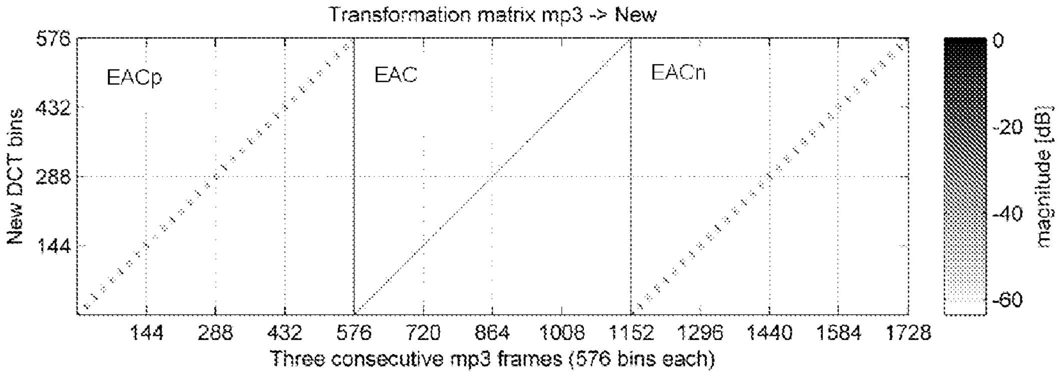
FIG. 6 exemplary full enhanced alias compensation matrices for MP3 to intermediate pseudo-MDCT mapping (long windows)

The resulting full matrices, exemplarily for long windows, are depicted in FIG. 6. As can be seen, most of the transformation coefficients are zero, and require no computation at all. Particularly for the contribution matrix to the previous frame EACp and the contribution matrix to the next frame EACn, it can further be observed that the full matrices are substantially constituted by individual "tiles" or sub-matrices that are replicated 31 times along the main diagonals.

Figure 7:
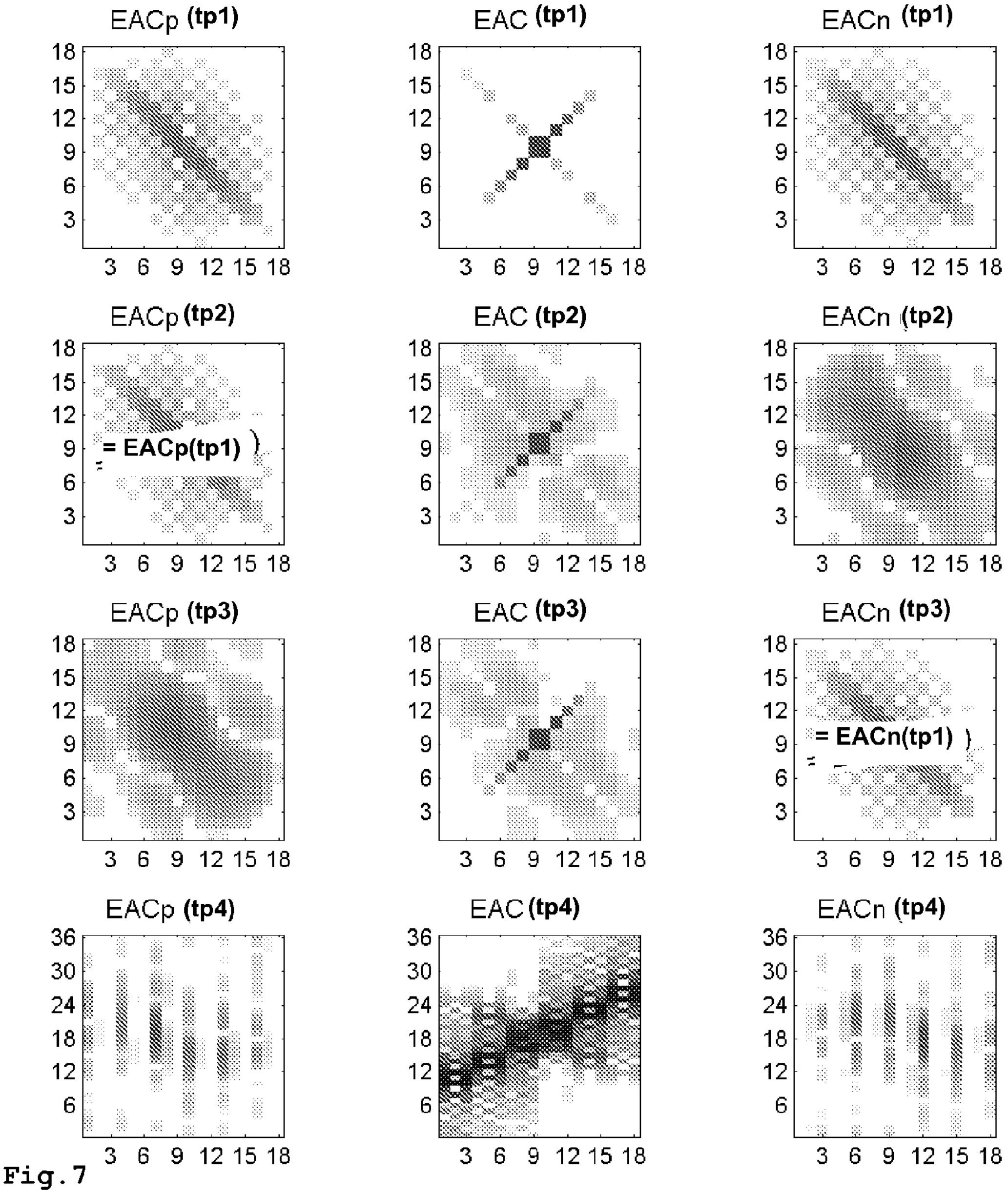
FIG. 7 individual tiles in the exemplary full enhanced alias compensation matrices of FIG. 6.

The three basic tiles, one for each of the Enhanced Alias Compensation matrices EAC,EACp,EACn, are shown in FIG. 7 for all four window types tp1,tp2,tp3,tp4. The tiles represent in principle a kind of complicated alias compensation for the MP3 hybrid filter bank.

In the above-mentioned example, tp1 corresponds to "long", tp2 to "start", tp3 to "stop" and tp4 to "short". The above-mentioned sub-matrices have in this example the dimension 18×18 for types "long", "start" and "stop", and the dimension 18×36 for type "short" (note however that in the case of EACn and EACp the number of coefficients is the same, since every other column is zero). For other filter bank domains, the dimension may be different.

In the following, resulting possibilities to achieve an efficient storage and computation are described. The twelve tiles illustrated in FIG. 10 have some advantageous similarities. The most important ones are the following:

First, the EAC(tp1) tile has non-zero coefficients only in the main diagonal and in the anti-diagonal. Therefore, this tile can be stored and computed with very limited effort.

Second, the tiles EAC(tp2) and EAC(tp3) consist of the tile EAC(tp1) plus some additional low level coefficients throughout the tiles. Therefore, some memory can be saved by only storing the difference between EAC(tp2)/EAC(tp3) and the EAC(tp1) tile. The remaining low level coefficients can be stored with a lower or even very low precision, so that the number of bits per coefficient and thus required memory area is lower.

In one embodiment, a diagonal of one, or unity matrix, is added to the illustrated EAC tiles in the middle column (i.e. sub-matrices) to obtain the actual EAC tiles that are used in the matrices of FIG. 6. I.e. the values of the diagonal have a positive offset of one, so that the values to be stored are smaller. Further, the effect of the inhomogeneous aspect ratio for short windows is visible.

Third, EACp(tp2) is equal to EACp(tp1), and EACn(tp3) is equal to EACn(tp1).

Fourth, the contribution matrices EACp(tp1) and EACn (tp1) are similar in the sense that they can be very efficiently stored and computed by using their sum and difference. I.e. the difference EACp(tp1)−EACn(tp1) has a similar structure consisting of a diagonal plus an anti-diagonal as the EAC(tp1) tile. Efficient storage and computation is possible by jointly storing and computing EACp(tp1) and EACn(tp1).

Fifth, the tiles EACp(tp4) and EACn(tp4) are sparse in the sense that some of the columns are zero or near zero. These columns need not be stored or computed.

Advantageously, the frequency-dependency of prior art mapping matrices has thus been converted into small variations within these tiles, which are repeated every 18 sub-bands (or frequency bins) within the Enhanced Alias Compensation matrices EAC,EACp,EACn. No further frequency dependence remains in the mapping.

In the following, sub-band sign correction (SSC) is described, which is employed as one sub-step in the second transformation step from the intermediate domain $D_i$ to the target filter bank domain $D_T$. Note that the term sub-band sign correction herein refers to groups of filter bank domain sub-bands ("bins"). E.g. in FIGS. 8 and 9 a sub-band to which uniform sign correction is applied contains eighteen filter bank domain sub-bands, or bins. As shown in FIG. 3, sub-band sign correction receives sub-band coefficients psdo(m−1), psdo(m),psdo(m+1) of the intermediate domain, e.g. pseudo-MDCT, as input.

The phase modification term $\phi_i$ of eq. 4 and 5 comprises an inversion of every other sub-band of the MP3 polyphase filter bank. I.e. after every 18 bins, the term $\phi_i$ jumps by $\pi$. This reflects the behaviour of the MP3 filter bank, which is similar. Thus, the sub-band sign correction is an adaptation to the source filter bank characteristics.

Figure 8:
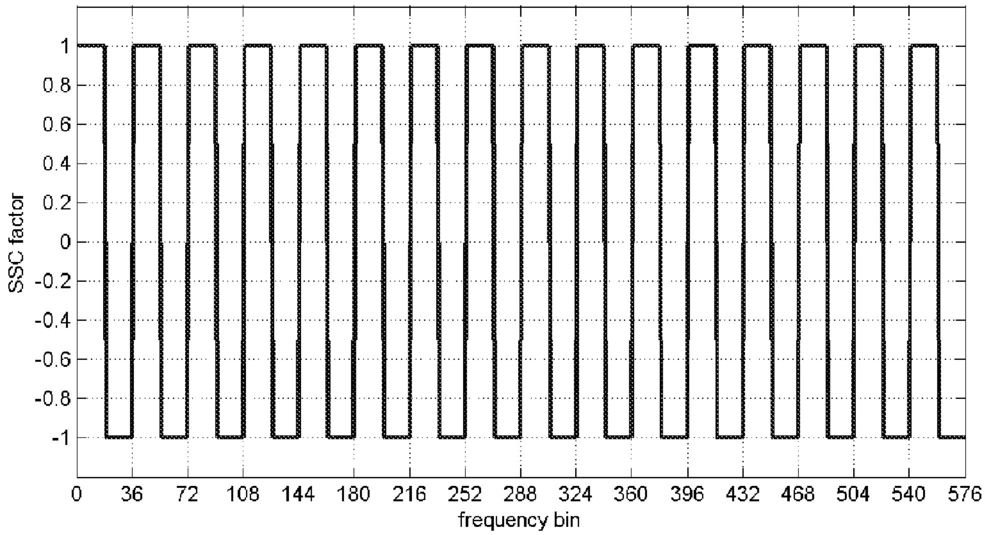
FIG. 8 a diagram showing sub-band sign correction.

For mapping from the pseudo-MDCT to the Integer MDCT, a first step comprises a correction of these alternating signs of the sub-bands by applying a sub-band sign correction (SSC), wherein the pseudo-MDCT values are multiplied with the SSC function illustrated in FIG. 8.

A further mapping step is required in order to compensate for the additive phase term of the warped pseudo-MDCT, as compared to the original MDCT. Individual phase correction is necessary for each of the employed window types ($tp_1$-$tp_4$ e.g. long, start, short, stop), and for each transition (long to long, short to short). The phase correction can be performed e.g. by applying mapping matrices. In one embodiment, due to the specific structures of these mapping matrices, an approach of weighting plus filtering of the frequency domain bins can be used. This is described in the following.

There is considerable redundancy in most parts of all twelve applicable phase correction matrices.

First of all, in the MP3 to MDCT mapping example, the following transition matrices are identical: PCp(long)=PCp (start), PCn(long)=PCn(stop), PCn(start)=PCn(short), and PCp(stop)=PCp(short). This property reduces the number of different phase correction matrices to eight, since redundancy reduction can be used for storage of the matrices.

Further, the matrices to be applied for contributions to the previous frame (e.g. PCp(long)) and to the next frame (e.g. PCn(long)) are very similar. They differ only in the sign of every other coefficient. Thus, in one embodiment these two matrices are implemented as two sub-matrices followed by a "butterfly" operation. This is known as a simultaneous addition and subtraction of two values using an adder S1 and a subtractor (or adder and sign inverter) S2, as shown in FIG. 2.

Thirdly, most of the matrices can be decomposed into a frequency-dependent weighting operation W and an additional convolution filter that is applied to the frequency bins. This decomposition has the particular advantage that only one weighting factor per frequency bin plus a single fixed filter impulse response have to be stored. Thus, in one embodiment the above-mentioned sub-matrices are implemented as a weighting operation W and two convolution filters H1,H2. This convolution is applied in the frequency domain, thus corresponding to a multiplication in the time domain. The theoretic basis for this convolution is the time-domain windowing that would be applied in a conventional sequence of MP3 synthesis, time delay, and MDCT analysis.

Figure 2:
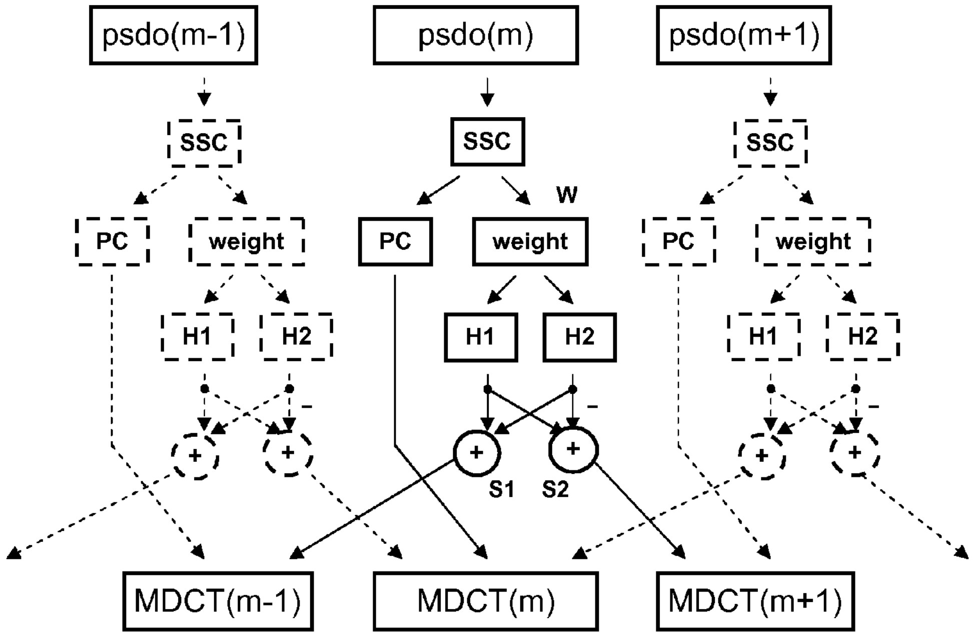
FIG. 2 an exemplary implementation for the phase correction step for long windows.

The described implementation, as shown in FIG. 2, is very efficient in terms of hardware usage and operational complexity. Particularly for long windows, the above redundancies lead to a very efficient system architecture, where the phase correction steps PCp(long) and PCn(long) are computed jointly by applying a weighting factor per frequency bin and subsequent filtering with the two filters H1 and H2. These two filters are sparse in the sense that H1 has non-zeros coefficients only in odd positions while H2 has non-zero coefficients only in even positions. Addition of the filter outputs results in the phase correction contribution to the previous MDCT frame, and subtraction yields the contribution to the next MDCT frame.

Additional efficiency can be derived from exploiting even more specific similarities in the phase correction mapping matrices, e.g. between PC(start), PC(stop), and PC(long). However, the same principles apply as described above.

In the following, two exemplary implementations are described.

Figure 4:
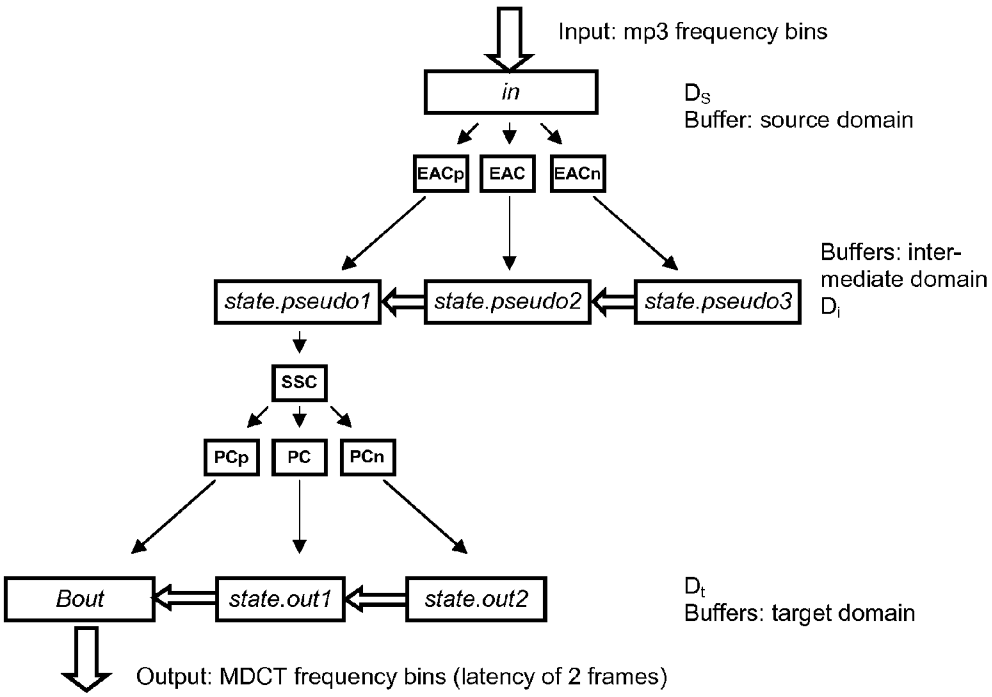
FIG. 4 an exemplary general implementation structure.

FIG. 4 shows a straight-forward implementation of the above-described two-stage mapping procedure. At the beginning of each frame cycle, the buffers are shifted in the sense that state.pseudo1<=state.pseudo2, state.pseudo2<=state.pseudo3, and state.pseudo3<=0.

Similarly, Bout<=state.out1, state.out1<=state.out2, and state.out2<=0. Each input frame in of MP3 frequency bins is mapped using multiplication with matrices EACp,EAC, EACn, and the results are added to the buffers state.pseudo1, state.pseudo2, and state.pseudo3, respectively. Then, subband sign correction (SSC) and phase correction (PC) are applied to the buffer state.pseudo1.

The three resulting contributions PCp*SSC, PC*SSC, and PCn*SSC are added to the three buffers Bout, state.out1, and state.out2, respectively. The buffer Bout is ready and can be provided to the output.

In the described implementation example, the output vector has a latency of two frame cycles with respect to the input frame. The structure shown in FIG. 4 is of specific interest if a low complexity implementation is desired, since the contributions of EACp and EACn can be computed jointly and additionally also the contributions of PCp and PCn can be computed jointly.

Figure 5:
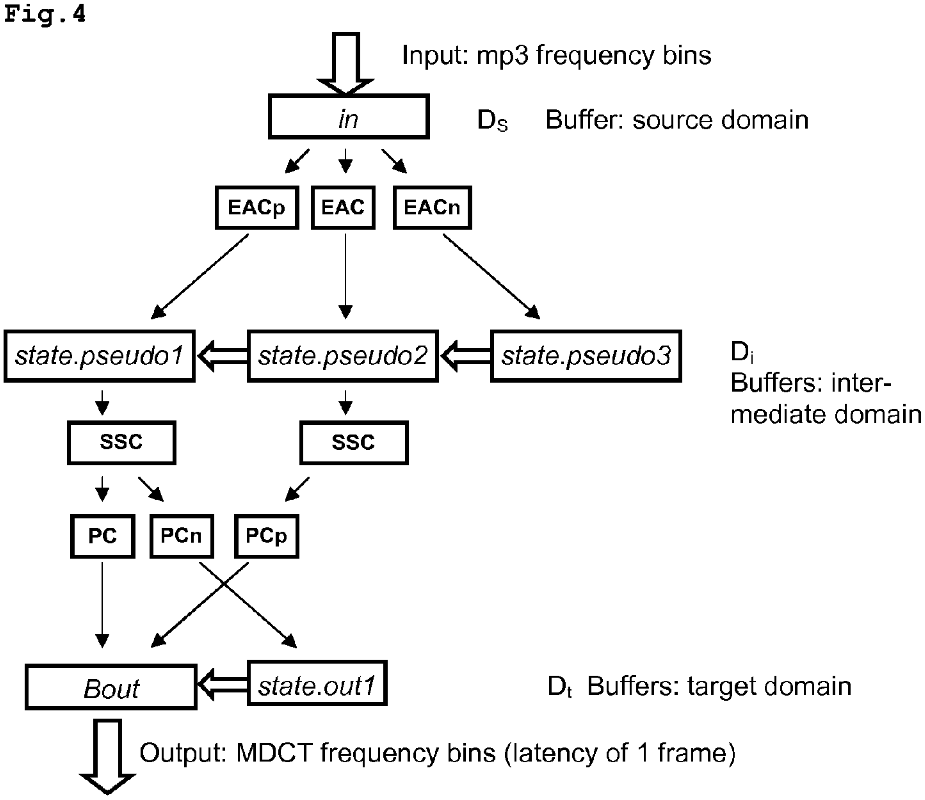
FIG. 5 an exemplary implementation structure for lower latency.

It may however be desired to have an implementation with lower latency. An alternative implementation with a latency of only one frame cycle is illustrated in FIG. 5. In this implementation example, the fact is exploited that PCp•SSC•EACp (corresponding to the path that leads directly from the source domain buffer in via the matrix EACp, SSC and PCp to the target domain buffer Bout) is substantially zero. Therefore, the contribution of PCp•SSC to the output vector can already be computed from the buffer state.pseudo2, although this buffer does not yet contain the contribution via EACp of the current input MP3 vector.

This approach has the advantages that only one frame of latency is generated, since one vector of storage can be saved (state.out2). On the other hand, the alternative implementation can no longer exploit the symmetries of the phase correction matrices by jointly computing PCp and PCn.

An advantage of the described two-stage approach is that the size of all lookup tables is much smaller than in architectures known from the prior art. In the described example of MP3 to Integer MDCT mapping, the lookup tables sum up to only 12664 bytes, in contrast to 174348 bytes that would be used for the conventional direct-mapping algorithm.

It will be understood that the present invention has been described purely by way of example, and modifications of detail can be made without departing from the scope of the invention.

Each feature disclosed in the description and (where appropriate) the claims and drawings may be provided independently or in any appropriate combination. Features may, where appropriate be implemented in hardware, software, or a combination of the two. Connections may, where applicable, be implemented as wireless connections or wired, not necessarily direct or dedicated, connections. Reference numerals appearing in the claims are by way of illustration only and shall have no limiting effect on the scope of the claims.

The invention claimed is:

1. A method for transforming first data frames of a first filter bank domain to second data frames of a different second filter bank domain, comprising steps of transcoding, in a microprocessor, sub-bands of the first filter bank domain into sub-bands of an intermediate domain that corresponds to said second filter bank domain but has warped phase;

transcoding, in the microprocessor, the sub-bands of the intermediate domain to sub-bands of the second filter bank domain, wherein a phase correction is performed on the sub-bands of the intermediate domain by weighting and filtering the sub-band coefficients of the intermediate domain.

2. Method according to claim 1, wherein the second data frame is composed from at least three consecutive first data frames, and the first data frame is used in the transcoding to the second filter bank domain of at least three consecutive second data frames.

3. Method according to claim 1, wherein at least the second and the intermediate domain can be generated from time domain signals by transforms that comprise a cosine function, and wherein said warped phase of the intermediate filter bank domain corresponds to a frequency dependent additive phase term in the cosine function.

4. Method according to claim 1, wherein the step of transcoding sub-bands of the first filter bank domain into sub-bands of the intermediate domain comprises removing residual alias terms that originate from a mp3 poly-phase filter bank from the sub-bands of the first filter bank domain.

5. Method according to claim 3, wherein mapping matrices are employed, each of which comprising individual but identical sub-matrices along their main diagonals and zeros in other positions.

6. Method according to claim 1, wherein the step of transcoding the sub-bands of the intermediate domain to sub-bands of the second filter bank domain comprises sub-band sign correction.

7. Method according to claim 6, wherein the sub-band sign correction comprises inversion of every other sub-band.

8. Method according to claim 1, wherein the step of transcoding the sub-bands of the intermediate domain to sub-bands of the second filter bank domain is suitable for compensating an additive phase term of the intermediate domain.

9. Method according to claim 1, wherein the filter bank domains use transformation time windows, wherein for said time windows a plurality of different window shapes is pre-defined, and the first and second data frames may use different window shapes, and wherein individual phase correction is done for each of said window shapes and for transitions between window shapes of the intermediate filter bank domain and the second filter bank domain.

10. Method according to claim 1, wherein said weighting is frequency-dependent, wherein different frequency sub-bands may have different weight, and said filtering is performed by convolution filters.

11. Method according to claim 1, wherein said filtering uses two filters that are sparse in the sense that one filter has non-zero coefficients only in odd positions and the other filter has non-zero coefficients only in even positions.

12. Method according to claim 1, wherein addition of the outputs of the two filters gives the phase correction contribution to the previous of the frames of the second domain, and subtraction of said outputs gives the contribution to the next of the frames of the second domain.

13. Method according to claim 1, wherein the frames are audio signal frames, and the first filter bank domain is that of an MP3 hybrid filter bank, and the second filter bank domain is that of an MDCT filter bank.

14. An apparatus for transforming first data frames of a first filter bank domain to second data frames of a different second filter bank domain, comprising a microprocessor configured to transform sub-bands of the first filter bank domain into sub-bands of an intermediate domain that corresponds to said second filter bank domain with warped phase, wherein residual alias terms are removed; and transcode the sub-bands of the intermediate domain to sub-bands of the second filter bank domain, wherein the second transcoding means comprises phase correction means for performing phase correction on the sub-bands of the intermediate domain, wherein said phase correction is performed by weighting means for weighting and filter means for filtering the sub-band coefficients of the intermediate domain.

15. Apparatus according to claim 14, wherein said phase correction is performed by computing means for applying mapping matrices.

16. Apparatus according to claim 13, wherein the filter means simultaneously perform two phase correction sub-steps corresponding to two mapping matrices that relate to a previous and a future frame of the second filter bank domain.

* * * * *